United States Patent
Banzo

(10) Patent No.: US 7,701,321 B2
(45) Date of Patent: Apr. 20, 2010

(54) SYSTEM AND METHOD FOR INTERCONNECTING A PLURALITY OF PRINTED CIRCUITS

(75) Inventor: Juan I. Banzo, Cd Juarez (MX)

(73) Assignee: Delphi Technologies, Inc., Troy, MI (US)

(*) Notice: Subject to any disclaimer, the term of this patent is extended or adjusted under 35 U.S.C. 154(b) by 271 days.

(21) Appl. No.: 11/801,500

(22) Filed: May 10, 2007

(65) Prior Publication Data

US 2008/0278276 A1    Nov. 13, 2008

(51) Int. Cl.
H01H 85/04    (2006.01)

(52) U.S. Cl. .................. 337/264; 337/186; 337/284

(58) Field of Classification Search ............ 337/186, 337/264, 284
See application file for complete search history.

(56) References Cited

U.S. PATENT DOCUMENTS

| | | | | |
|---|---|---|---|---|
| 1,488,420 A * | 3/1924 | Watts | ........................ | 337/264 |
| 1,858,157 A * | 5/1932 | Lagandro | .................... | 337/263 |
| 1,926,445 A * | 9/1933 | Klopfenstein | ............... | 337/264 |
| 3,235,345 A * | 2/1966 | Fuller et al. | ................. | 428/585 |
| 3,328,749 A * | 6/1967 | Kukla | ........................ | 439/389 |
| 3,783,433 A * | 1/1974 | Kurtz et al. | ................... | 439/82 |
| 3,813,626 A * | 5/1974 | Cetola et al. | ................ | 337/245 |
| 3,871,738 A * | 3/1975 | Dechelette | .................. | 439/830 |
| 4,166,667 A * | 9/1979 | Griffin | ........................ | 439/637 |
| 4,296,398 A | 10/1981 | McGalliard | | |
| 4,376,927 A * | 3/1983 | McGalliard | ................ | 337/297 |
| 4,580,124 A | 4/1986 | Borzoni | | |
| 4,599,596 A | 7/1986 | Arikawa et al. | | |
| 4,827,238 A * | 5/1989 | Kozel | ......................... | 337/256 |
| 4,884,050 A * | 11/1989 | Kozel | ......................... | 337/264 |
| 4,894,633 A | 1/1990 | Holtfreter | | |
| 4,988,969 A | 1/1991 | Gurevich | | |
| 5,017,159 A * | 5/1991 | Legrady | ...................... | 439/741 |
| 5,324,214 A * | 6/1994 | De Castro | .............. | 439/620.26 |
| 5,409,402 A * | 4/1995 | Ball et al. | ............. | 439/620.34 |
| 5,581,225 A | 12/1996 | Oh et al. | | |
| 5,628,654 A * | 5/1997 | Lineberry, Jr. | ......... | 439/620.34 |
| 5,874,884 A * | 2/1999 | Hull et al. | ................... | 337/241 |
| 5,923,239 A | 7/1999 | Krueger et al. | | |
| 6,407,657 B1 * | 6/2002 | Oh | .............................. | 337/197 |
| 6,456,186 B1 | 9/2002 | Oglesbee | | |
| 6,781,503 B1 * | 8/2004 | Kubota | ....................... | 337/230 |

(Continued)

FOREIGN PATENT DOCUMENTS

DE    102 23 382    12/2003

(Continued)

OTHER PUBLICATIONS

European Search Report dated Nov. 20, 2009.

*Primary Examiner*—Anatoly Vortman
(74) *Attorney, Agent, or Firm*—Thomas N. Twomey

(57) ABSTRACT

A primary electrical fuse is attached to a printed circuit board. The primary electrical fuse comprises a first and second terminal, a fusible element disposed between the first and second terminals electrically linking the first terminal and the second terminal, and receiving tip sections located on the first and second terminals that receive a replacement electrical fuse to electrically connect the first and second terminals with a replacement fusible element.

6 Claims, 2 Drawing Sheets

U.S. PATENT DOCUMENTS

| | | | |
|---|---|---|---|
| 6,878,004 B2 * | 4/2005 | Oh | 439/250 |
| 7,116,208 B2 | 10/2006 | Nishimura et al. | |
| 7,355,502 B1 * | 4/2008 | Nguyen et al. | 337/186 |
| 7,477,130 B2 * | 1/2009 | Fukushige et al. | 337/297 |
| 2003/0222752 A1 | 12/2003 | Ohashi et al. | |
| 2004/0196135 A1 * | 10/2004 | Didier | 337/198 |

FOREIGN PATENT DOCUMENTS

| | | |
|---|---|---|
| EP | 0 258 664 | 3/1988 |
| EP | 1 641 096 | 3/2006 |
| FR | 2 852 140 | 9/2004 |

* cited by examiner

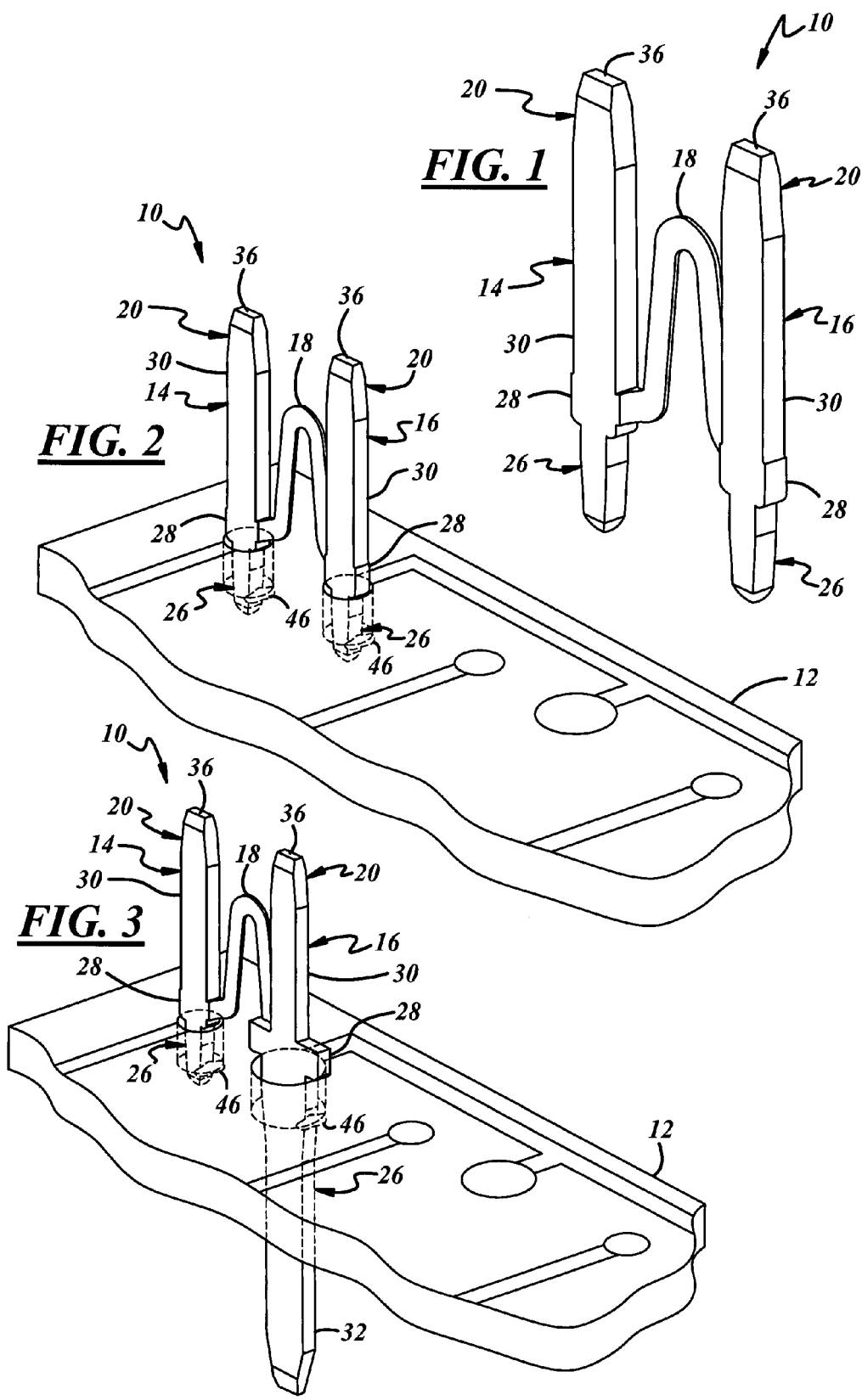

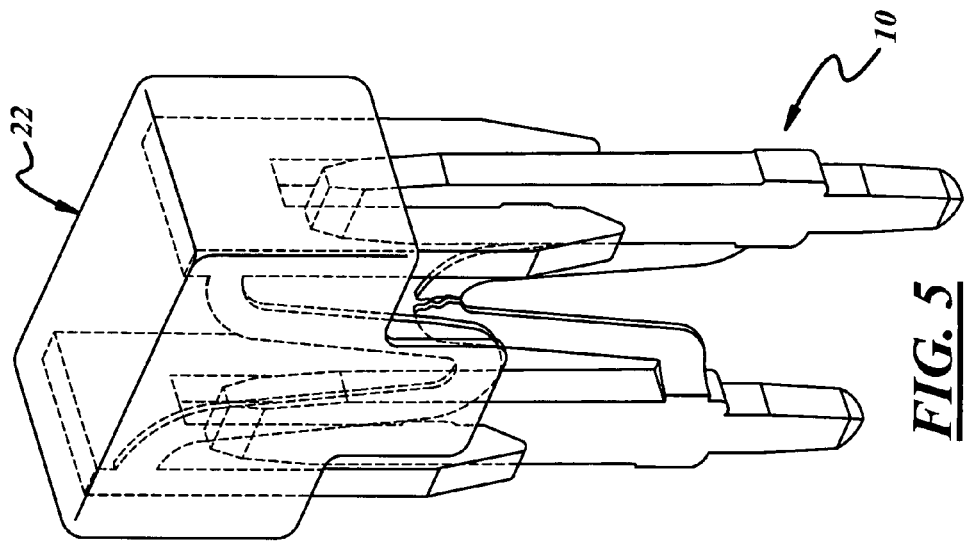
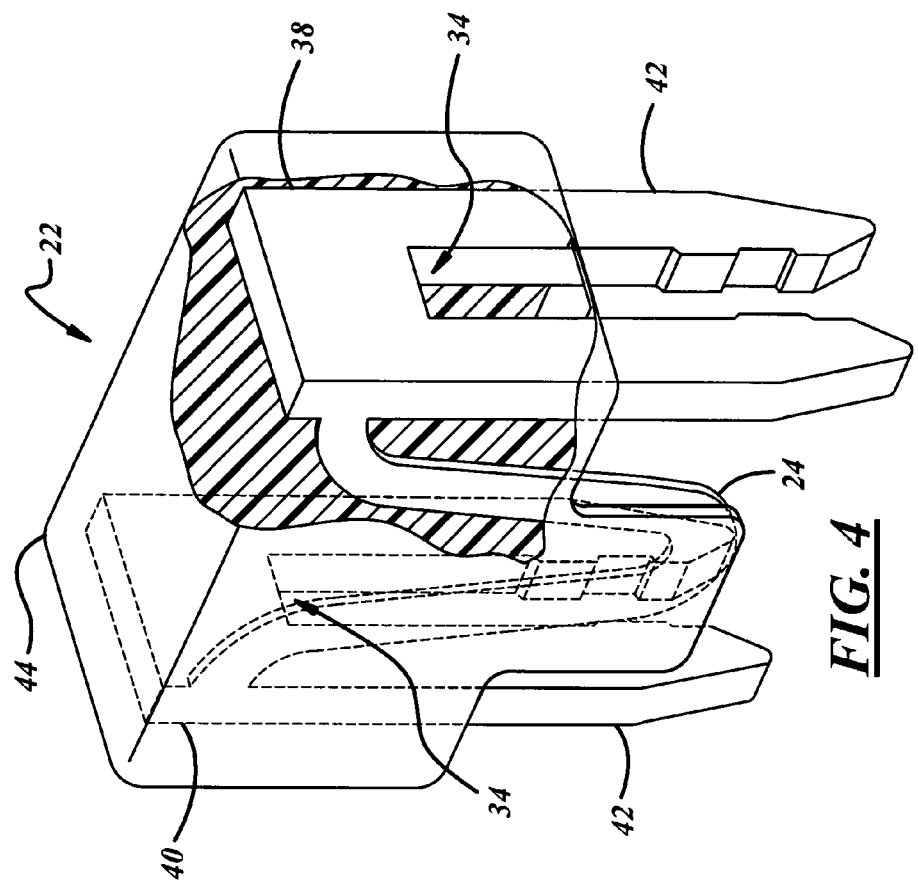

SYSTEM AND METHOD FOR INTERCONNECTING A PLURALITY OF PRINTED CIRCUITS

BACKGROUND OF THE INVENTION

Fuses, or fusible links, are well known and protect electrical circuits from excess current that may harm electrical circuits or devices. Vehicles have used fuses to protect electrical circuits and devices for many years. These fuses often take the form of a plug-in, blade-type fuse. This fuse type usually comprises an all-metal fuse element stamped from a strip of fuse metal. A single-piece housing, having an opening at one end, is then attached to the stamped metal fuse. The opening allows two terminal blades to extend from the housing and plug into a bussed electrical center housing printed circuit boards and regulating current. After the electrical circuit or device connected to the fuse suffers an unwanted increase in current, the plug-in blade type fuse is removed and replaced with a new plug-in blade type fuse. While plug-in blade type fuses have worked successfully, these fuses sometimes may be more expensive to install and produce than other alternatives.

SUMMARY OF THE INVENTION

In one aspect of the invention, a primary fuse is adapted to attach to a printed circuit board. The primary fuse comprises a first and second terminal, a fusible element disposed between the first and second terminals electrically linking the first terminal and the second terminal, and receiving tip sections located on the first and second terminals capable of receiving a replacement fuse adapted to electrically connect the first and second terminals with a replacement fusible element. Additionally, at least one of the first and second terminals has a mounting tip section defined by shoulder sections and is adapted to mount to a printed circuit board.

In a second aspect of the invention, an electrical fuse adapts to attach to a printed circuit board. The electrical fuse comprises a first and second terminal, a fusible element disposed between the first and second terminals electrically linking the first terminal and the second terminal, and receiving tip sections located on the first and second terminals capable of receiving a replacement fuse adapted to electrically connect the first and second terminals with a replacement fusible element. Additionally, at least one of the first and second terminals has a mounting tip section defined by shoulder sections extending through an opening in a printed circuit board and permanently attaching to the printed circuit board via an electrically-conductive connection.

In a third aspect of the invention, an electric fuse assembly adapts to attach to a printed circuit board. The electric fuse assembly comprises a primary fuse having a first terminal and a second terminal and a fusible element disposed between the terminals electrically linking them. Also included with the electric fuse assembly is a replacement fuse having a third terminal and a fourth terminal, a replacement fusible element disposed between them electrically linking the terminals, and receiving tip sections located on the primary fuse capable of receiving the replacement fuse that is adapted to electrically connect the first terminal to the second terminal with the replacement fusible element. At least one of the first terminal and second terminal has a mounting tip section, defined by shoulder sections, that extends through an opening in a printed circuit board and attaches to the printed circuit board via a electrically-conductive connection.

In a fourth aspect of the invention, a replacement fuse adapts for use with a primary fuse. The replacement fuse comprises a first terminal and a second terminal and a fusible element disposed between the first terminal and the second terminal electrically linking the terminals. The fusible element is offset from and substantially parallel to a fusible element of the primary electrical fuse and at least one socket is constructed to receive and electrically connect the replacement fuse to the primary electrical fuse.

A fifth aspect of the invention includes a method for providing a fuse assembly for use with a printed circuit board. The method comprises: providing a primary fuse having a first terminal and a second terminal wherein each terminal has shoulders that define mounting tip sections, coupling the first terminal and the second terminal with a primary fusible element capable of regulating electrical current, and permanently connecting the primary fuse to the printed circuit board at the first terminal and the second terminal so that electrical current flows through the primary electrical fuse.

BRIEF DESCRIPTION OF THE DRAWINGS

FIG. 1 is a perspective view of an electrical fuse adapted to attach to a printed circuit board.

FIG. 2 is a perspective view of an electrical fuse used with a printed circuit board.

FIG. 3 is a perspective view of another embodiment of an electrical fuse used with a printed circuit board.

FIG. 4 is a perspective view of a replacement fuse.

FIG. 5 is a perspective view of an electrical fuse assembly.

DETAILED DESCRIPTION OF THE PREFERRED EMBODIMENTS

Referring now to the drawings, FIG. 1 illustrates a primary fuse generally shown at 10 adapted to attach to a printed circuit board. The primary electrical fuse 10 comprises a first terminal generally indicated at 14 and a second terminal generally indicated at 16. A fusible element 18 electrically links the first terminal 14 and second terminal 16. On the first terminal 14 and the second terminal 16 are receiving tip sections generally indicated at 20 capable of receiving a replacement electrical fuse adapted to electrically connect the first terminal 14 to the second terminal 16 with a replacement fusible element. Additionally, at least one of the first terminal 14 and second terminal 16 has a mounting tip section, generally indicated at 26 and defined by shoulders 28, adapting to mount to a printed circuit board.

A printed circuit board 12, as shown in FIGS. 2 and 3, uses vias to mechanically support and electrically connect a primary fuse 10 to electrically conductive pathways etched from copper sheets laminated onto a non-conductive substrate. Often, printed circuit boards 12 use a plurality of conductive layers sandwiched by insulating material, or substrates, and are laminated using heat, pressure and adhesive. Conductive layers of the printed circuit board 12 may be connected using drilled holes or openings called vias. These drilled holes are either filled with rivets or electroplated. Although the vias may not form electrical connections to all layers, vias generally are drilled completely through the printed circuit board 12. Some exceptions call for a via visible only on one side of the printed circuit board 12, called a blind via. Another example is a via completely sandwiched between layers of substrate, called a buried via. In most cases, the printed circuit board 12 conductive layer uses a thin layer of copper attached to the substrate. After attaching the copper layer, electrically conductive paths are created by removing unwanted copper leaving only small traces that make up the path. Some examples of removing copper and forming a printed circuit board 12 conductive layer include silk screen printing, photoengraving and milling.

It is also possible to create a conductive layer on the substrate using an additive method. One example of this method calls for layering the entire surface of the substrate with a thin copper layer. The manufacturer then applies a mask exposing only the area where electrically conductive paths will attach. The printed circuit board 12 then receives copper on the exposed areas. Afterwards, the manufacturer removes the mask and separates the electrically conductive paths from the thin copper layer by etching a border around the electrically conductive paths. Following the construction of the electrically conductive paths, the printed circuit boards 12 then may be populated with electrical components. The most common attachment method used is surface mount technology. This attachment method calls for using electrical components that have small metal tabs or terminals that may be connected directly to the surface of the printed circuit board 12.

The first terminal 14 and second terminal 16 of the primary electrical fuse 10 may be described in sections, such as a main body section 30, a receiving tip section generally indicated at 20, and a mounting tip section generally indicated at 26. Each section of the terminals (14 & 16) may be substantially rectangular in cross-section. While maintaining the rectangular cross-sectional shape, the cross-sectional area of the first terminal 14 and second terminal 16 may vary at different points along the length of each terminal (14 & 16). For instance, the main body section 30 may have a substantially constant cross-sectional area. In other words, the entire length of the main body section 30 may maintain substantially the same cross-sectional area. While a rectangular cross-sectional shape is illustrated here, other cross-sectional shapes are possible, such as polygonal, oval or circular. Formed at each end of the main body section 30 may be the mounting tip section 26 and the receiving tip section 20.

The mounting tip section 26 may be located at ends of the first and second terminals (14 & 16) opposite to the receiving tip section 20, and may also use a varying cross-sectional area. The mounting tip section 26 may provide the electrical connection between the printed circuit board 12 and the primary fuse 10 while also providing physical support to the primary fuse 10 and, if added, a replacement fuse as well. Shoulders 28 may also be used, formed integrally with the terminals (14 & 16), engaging a printed circuit board 12. Or the shoulders 28 may be formed separate from the terminals (14 & 16) and attached to the terminals (14 & 16) during an assembly process. These shoulders 28 may take the form of at least one flange that extends outwardly and radially from the terminals (14 & 16), providing compressive and lateral support for the primary fuse 10 and, if added, the replacement fuse. The shoulders 28 may be various sizes depending on such factors as the size of the primary fuse 10, the size of the replacement fuse used with the primary fuse, the size and shape of the printed circuit board 12 opening, or other factors related to mounting and supporting the primary fuse 10.

Additionally, the length of the mounting tip section 26 of the first terminal 14 could be different from the length of the mounting tip section 26 of the second terminal 16. As shown in FIG. 3, the mounting tip section 26 of the second terminal 16 may include an extended portion 32. The extended portion 32 may be designed to carry electrical current from the printed circuit board 12 or the primary fuse 10 to another location. In one embodiment, the extended portion 32 may be used to carry electrical current from the primary fuse 10 to a location within a bussed electrical center (not shown). The extended portion 32 may also electrically attach to a wiring harness located in the bussed electrical center. The wiring harness may be bundled into a connector capable of attaching to a bussed electrical center. Bussed electrical centers, also called electrical centers or sometimes fuse boxes, are well known to those skilled in the art. The extended portion 32 may also use a constant cross-sectional area across its entire length or alternatively the cross-sectional area may vary, creating a tapered effect.

The cross-sectional area of the mounting tip section 26, more particularly the cross-sectional area of the portion of the mounting tip section 26 extending away from the shoulders 28, may vary along the length of the section 26. In one embodiment, as the distance away from the shoulders 28 increases, the cross-sectional area of the mounting tip section 26 decreases. This reduction in cross-sectional area may facilitate inserting the mounting tip section 26 into openings or vias in the printed circuit board 12. Additionally, the reduction in cross-sectional area may create a wedged shape. The wedged shape may frictionally engage the opening or via in the printed circuit board 12 and firmly attach the primary fuse 10, both physically and electrically, to the printed circuit board 12. In another embodiment, the cross-sectional area of the mounting tip section 26 could remain constant along its length. Either cross-sectional profile may be used in conjunction with equal length mounting tip sections 26, as shown in FIGS. 1 and 2, or with mounting tip sections 26 of unequal lengths, as shown in FIG. 3.

The receiving tip sections, generally indicated at 20 and located on the first terminal 14 and the second terminal 16, are capable of receiving a replacement fuse. The receiving tip section 20 may be adapted to electrically connect the first terminal 14 to the second terminal 16 with a replacement fusible element. The receiving tip section 20, located on a terminal (14 & 16) at an end opposite the mounting tip section 26, adapts to receive a replacement fuse and may have a varying cross-sectional area. Like the main body section 30, the receiving tip section 20 may have a substantially rectangular cross-sectional shape, but other shapes, such as polygonal, are possible. However, the cross-sectional area may vary as a constant ratio across the entire length of the receiving tip section 20, or it may vary by different ratios at different stages. The changing cross-sectional area may facilitate the connection of a replacement fuse to the primary fuse 10 in the event the primary fuse 10 fails.

Generally, the shape of the receiving tip section 20 will closely mimic the shape of sockets used by a replacement fuse. For example, the receiving tip section 20 may use a gradually increasing cross-sectional area, as measured from the end furthest from the shoulders 28 to the point nearest the shoulders 28. This design creates an increasing amount of pressure between the receiving tip section 20 and a replacement fuse socket. As a replacement fuse socket engages the receiving tip section 20 and a replacement fuse is moved closer to the primary fuse 10, the receiving tip section's 20 increasing cross-sectional area exerts a greater force on the replacement fuse socket. This force may create sufficient friction to firmly hold a replacement fuse in close proximity to the primary fuse 10 and also provide an electrical connection between the primary fuse 10 and a replacement fuse. Additionally, the receiving tip section 20 may have a blunt end 36 that controls the distance between a replacement fuse and the primary fuse 10 and is located at a point furthest from the shoulders 28.

If the cross-sectional shape of the receiving tip section 20 is rectangular, the shape may change by varying the length of only two sides of the rectangular cross-section or by varying the length of all four sides at once. The end of the receiving tip section 20 located opposite the shoulders 28 may have a cross-sectional area equal to or less than the cross-sectional area of the main body section 30. While the cross-sectional shape described here is rectangular, a similar function may be accomplished using other shapes. For instance, the receiving tip section 20 may be formed using a conical cross-sectional shape. The conical-shaped receiving tip section 20 may then engage a similarly-shaped replacement fuse socket, and the socket may then frictionally hold a replacement fuse in close proximity to the primary fuse 10 and carry electrical current from the first and second terminals (14 & 16) through a replacement fuse. The receiving tip section 20 and main body section 30 of the terminals (14 & 16) may be connected to a printed circuit board 12 through the mounting tip section 26 of the terminals (14 & 16). Electrically connecting the first terminal 14 to the second terminal 16 is a fusible element 18 disposed between the first terminal 14 and the second terminal 16.

The fusible element 18 electrically links the first terminal 14 and the second terminal 16. The fusible element 18 may be formed integrally with the first terminal 14 and the second terminal 16 or may be manufactured separately and electrically connected to both the first terminal 14 and the second terminal 16 after manufacture. Various amperage ratings may be realized by changing the characteristics of the material used to manufacture the fusible link 18. For instance, the fusible element 18 may be substantially horseshoe shaped or U-shaped and electrically connected to each terminal (14 & 16). Or in another embodiment the fusible element 18 may be S-shaped. In yet another embodiment, the fusible element 18 may be substantially straight.

FIGS. 4 and 5 show a replacement fuse generally shown at 22 adapted for use with the primary fuse 10. The replacement fuse 22 comprises a first terminal generally indicated at 38, a second terminal generally indicated at 40, and a fusible element 24 disposed between the first terminal 38 and the second terminal 40 electrically linking them. The fusible element 24, which may also be called a replacement fusible element 24, may be offset from and substantially parallel to a fusible element 18 of the primary fuse 10. Also, the replacement fuse 22 uses at least one socket generally indicated at 34 constructed to receive and electrically connect the replacement fuse 22 to the primary fuse 10.

The first terminal 38 and second terminal 40 of the replacement fuse 22 may provide both an electrical connection between the replacement fuse 22 and the primary fuse 10 and also provide structural support for mounting the replacement fuse 22 to the primary fuse 10. For instance, the first terminal 38 and second terminal 40 of the replacement fuse may use fork-shaped connectors 42 or members that firmly grip the primary fuse 10. These fork-shaped connectors 42 may engage the primary fuse 10 by sliding over the first terminal 14 and second terminal 16 of the primary fuse 10 into a position where the tines of each fork-shaped connector 42 may be positioned on opposite sides of the first terminal 14 and second terminal 16 of the primary fuse 10, physically supporting the replacement fuse 22 to in relation to the primary fuse 10. Electrically linked to the fork-shaped connectors 42 are sockets 34 capable of receiving the first terminal 14 and second terminal 16 of the primary fuse 10.

Sockets 34 used by the replacement fuse 22 may be female-type sockets 34 to accept the receiving tip section 20 of the primary fuse 10. The sockets 34 may be shaped to closely conform to the receiving tip section 20 in both size and shape, rendering a snug fit between the two elements. The snug fit allows the primary fuse 10 to firmly support the replacement fuse 22, holding it in place while also providing an electrical connection between the primary fuse 10 and the replacement fuse 22. For example, the socket 34 may be fashioned primarily from metal and use deflectable metal tangs that yield when the receiving tip section 20 is inserted into the socket 34. Alternatively, the sockets 34 could yield very little while relying on the fork-shaped connectors 42 to physically support the replacement fuse 22 while the sockets 34 electrically connect the first and second terminals (14 & 16) of the primary fuse 10 to the replacement fusible element 24.

The replacement fusible element 24 may be located between the terminals (38 & 40) and it may be formed into a variety of shapes much like the fusible element 18 for the primary fuse 10. The replacement fusible element 24 may also be formed integrally with the sockets 34 or terminals (38 & 40) or may be manufactured separately and electrically connected to both sockets 34 or terminals (38 & 40) after manufacture. Various amperage ratings may be realized by changing the characteristics of the material used to manufacture the replacement fusible element 24. For instance, the replacement fusible element 24 may be substantially horseshoe shaped or U-shaped and electrically connected to each terminal (38 & 40). Or in another embodiment the replacement fusible element 24 may be S-shaped. In yet another embodiment, the replacement fusible element 24 may be substantially straight. In relation to the fusible element 18 for the primary fuse 10, the replacement fusible element 24 may be offset from the fusible element 18 for the primary fuse 10 in order for the primary fuse 10 and the replacement fuse 22 to harmonically fit together. This relationship may be appreciated by examining FIG. 5. For instance, if the fusible element 18 for the primary fuse 10 is mounted on one side of the primary fuse 10, the replacement fusible element 24 may be mounted on the side opposite of where the fusible element 18 for the primary fuse 10 is mounted. This arrangement allows a more compact arrangement, more efficiently using space.

The replacement fusible element 24, along with the sockets 34, may be substantially enclosed by a cover 44. The cover 44, as shown in FIGS. 4 and 5, may enclose the sockets 34, the first terminal 38 and second terminal 40 of the replacement fuse 22, the replacement fusible element 24 and the fork-shaped connectors 42. The cover 44 may be manufactured from polycarbonate, or any other durable, light and inexpensive material. If made from plastic or polycarbonate, the cover 44 may be fashioned in a variety of colors to denote the particular amperage of the replacement fuse 22 or any other identification purpose. If made from plastic, the cover 44 may be clear or opaque allowing a user to see within the replacement fuse 22 and ultimately see the replacement fusible element 24 and whether or not the replacement fusible element 24 is functional. Additionally, the cover 44 may substantially conform to the replacement fusible element 24. Shaping the cover 44 to conform in this manner may provide additional protection to the replacement fusible element 24 from damage.

The primary fuse 10 attaches to the printed circuit board 12 at the first terminal 14 and the second terminal 16 in order to provide interruptible current flow to the electrically conductive pathways. The attachments 46 may be electrically conductive or the attachments 46 may be both electrically conductive and structural. For instance, solder, a fusible metal alloy, may be used in-between the first terminal 14 and the printed circuit board 12 and also the second terminal 16 and the printed circuit board 12. The solder may suffice, by itself, to provide both the electrical and structural components of the attachment 46 between the primary fuse 10 and the printed circuit board 12. Alternatively, an attachment 46 between both the primary fuse 10 and the printed circuit board 12 providing both the electrical and structural components may take the form of a mechanical attachment, such as a screw and eyelet, latch or any other commonly known and suitable mechanical attachment. The mechanical attachment may be constructed from an electrically conductive material capable of providing both structural support and electrical conductivity. These attachments may be permanent or temporary. However, the solder or any other electrically conductive attachment 46 may provide only the electrical connection while the first terminal 14 or second terminal 16 could use a physical socket or other physical connection to provide a physical support for attaching to the printed circuit board 12. The physical socket may take the form of a housing (not shown) that has a plurality of openings designed to allow the first terminal 14, second terminal 16 or both to pass through the housing and electrically connect with a printed circuit board 12. The physical sockets will closely conform to the shape and length of the first terminal 14, second terminal 16, or both. A housing that uses a plurality of openings may take the form of a bussed electrical center, fuse box, or similar implementation, as mentioned previously.

It will be readily understood by those persons skilled in the art that the present invention is susceptible to broad utility and application. Many embodiments and adaptations of the present invention other than those described above, as well as many variations, modifications and equivalent arrangements, will be apparent from or reasonably suggested by the present invention and the foregoing description, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the following claims and the equivalents thereof.

We claim:

1. A primary fuse attached to a printed circuit board comprising:
    a first terminal and a second terminal;
    a fusible element linearly mounted between the first terminal and the second terminal electrically linking the first terminal and the second terminal, wherein the first terminal, second terminal, and fusible element are portions of a unitary structure with each portion being disposed to have one of its major surfaces facing the same direction as the respective major surface of the other portions to form a flat unitary structure; and
    receiving tip sections, located on the first terminal and the second terminal, for receiving a replacement fuse that electrically connects the first terminal to the second terminal with a replacement fusible element;
    wherein at least one of the first terminal and second terminal has a mounting tip section defined by shoulder sections that mount to a printed circuit board and has a major surface facing the same direction as a major surface of the fusible element.

2. The primary fuse as claimed in claim 1, wherein the receiving tip sections receive a replacement fuse having fork-shaped connectors.

3. The primary fuse as claimed in claim 1, wherein the mounting tip section is wedge-shaped and has a width at least at one point that is substantially identical to an opening in the printed circuit board.

4. An electric fuse assembly attached to a printed circuit board comprising:
    a primary fuse having a first terminal and a second terminal;
    a fusible element disposed between the first terminal and the second terminal electrically linking the first terminal and the second terminal, wherein the first terminal, second terminal, and fusible element are portions of a unitary structure with each portion being disposed to have one of its major surfaces facing the same direction as the respective major surface of the other portions to form a flat unitary structure;
    a replacement fuse having a third terminal and a fourth terminal wherein the third terminal and the fourth terminal each have fork-shaped connectors;
    a replacement fusible element linearly disposed between a tine of the fork-shaped connector of the third terminal and a corresponding tine of the fork-shaped connector of the fourth terminal electrically linking the third terminal and the fourth terminal, wherein the replacement fusible element and the fork-shaped connectors are portions of a second unitary structure; and
    receiving tip sections, located on the primary fuse, receiving the replacement fuse that electrically connects the first terminal to the second terminal with the replacement fusible element, wherein the fusible element is positioned linearly with respect to the first terminal and the second terminal and the replacement fuse is offset from the fusible element.

5. An electric fuse assembly as claimed in claim 4, wherein at least one of the first terminal and second terminal has a mounting tip section, defined by shoulder sections, extending through an opening in a printed circuit board and attaching to the printed circuit board via a electrically-conductive connection.

6. An electric fuse assembly as claimed in claim 4, wherein the replacement fuse has at least one socket that receives and electrically connects the replacement fuse to the primary fuse.

* * * * *